United States Patent
Akiyama

(10) Patent No.: US 10,629,440 B2
(45) Date of Patent: Apr. 21, 2020

(54) METHOD FOR MANUFACTURING COMPOSITE WAFER PROVIDED WITH OXIDE SINGLE CRYSTAL THIN FILM

(71) Applicant: Shin-Etsu Chemical Co., Ltd., Tokyo (JP)

(72) Inventor: Shoji Akiyama, Annaka (JP)

(73) Assignee: Shin-Etsu Chemical Co., Ltd. (JP)

( * ) Notice: Subject to any disclaimer, the term of this patent is extended or adjusted under 35 U.S.C. 154(b) by 0 days.

(21) Appl. No.: 16/086,467

(22) PCT Filed: Apr. 4, 2017

(86) PCT No.: PCT/JP2017/014072
§ 371 (c)(1),
(2) Date: Sep. 19, 2018

(87) PCT Pub. No.: WO2017/175755
PCT Pub. Date: Oct. 12, 2017

(65) Prior Publication Data
US 2019/0051525 A1    Feb. 14, 2019

(30) Foreign Application Priority Data

Apr. 5, 2016    (JP) .................................. 2016-075807

(51) Int. Cl.
*H01L 21/265* (2006.01)
*B23K 20/24* (2006.01)
(Continued)

(52) U.S. Cl.
CPC ............ *H01L 21/265* (2013.01); *B23K 20/24* (2013.01); *H01L 21/02* (2013.01); *H01L 21/425* (2013.01);
(Continued)

(58) Field of Classification Search
None
See application file for complete search history.

(56) References Cited

U.S. PATENT DOCUMENTS

| 5,374,564 A | 12/1994 | Bruel |
| 6,445,265 B1 | 9/2002 | Wright |

(Continued)

FOREIGN PATENT DOCUMENTS

| CN | 104078407 A | 10/2014 |
| JP | 3048201 B2 | 6/2000 |

(Continued)

OTHER PUBLICATIONS

"Temperature Compensation Technology for SAW-Duplexer Used in RF Front End of Smartphone", Taiyo Yuden Co., Ltd., Dempa Shimbun High Technology, Nov. 2012, 6 pages.

(Continued)

*Primary Examiner* — Angel Roman
(74) *Attorney, Agent, or Firm* — Lerner, David, Littenberg, Krumholz & Mentlik, LLP

(57) ABSTRACT

A composite wafer includes an oxide single crystal thin film of lithium tantalate or lithium niobate transferred onto the entire face of a support wafer and is free from cracking or peeling on a bonding interface between the support wafer and the oxide single crystal thin film. A method for manufacturing a composite wafer at least includes a step of forming an ion-implanted layer in an oxide single crystal wafer, a step of subjecting at least one of the ion-implanted surface of the oxide single crystal wafer and a surface of a support wafer to a surface activation treatment, a step of bonding the ion-implanted surface of the oxide single crystal wafer to the surface of the support wafer to form a laminate, a step of subjecting the laminate to a first heat treatment at a temperature not less than 90° C. and not causing cracking, a step of applying a mechanical impact to the ion-implanted (Continued)

layer, and a step of subjecting the support wafer having the transferred oxide single crystal thin film to a second heat treatment at 250° C. to 600° C. to yield a composite wafer.

15 Claims, 4 Drawing Sheets

(51) Int. Cl.

| | | |
|---|---|---|
| *H01L 21/425* | (2006.01) | |
| *H01L 27/12* | (2006.01) | |
| *H01L 41/187* | (2006.01) | |
| *H01L 41/312* | (2013.01) | |
| *H01L 21/02* | (2006.01) | |
| *H01L 21/762* | (2006.01) | |

(52) U.S. Cl.
CPC ........ *H01L 21/76254* (2013.01); *H01L 27/12* (2013.01); *H01L 41/187* (2013.01); *H01L 41/312* (2013.01)

(56) References Cited

U.S. PATENT DOCUMENTS

| | | | |
|---|---|---|---|
| 6,540,827 B1 | 4/2003 | Levy et al. | |
| RE39,484 E | 2/2007 | Bruel | |
| 8,309,431 B2* | 11/2012 | Nguyen | H01L 21/76254 |
| | | | 257/E21.568 |
| 2010/0107388 A1 | 5/2010 | Iwamoto | |
| 2010/0178749 A1* | 7/2010 | Faure | H01L 21/76254 |
| | | | 438/458 |
| 2011/0278993 A1 | 11/2011 | Iwamoto | |
| 2012/0280355 A1 | 11/2012 | Akiyama | |
| 2013/0092320 A1* | 4/2013 | Argoud | C23C 14/0005 |
| | | | 156/273.3 |
| 2014/0014029 A1* | 1/2014 | Faure | H01L 21/76254 |
| | | | 117/88 |
| 2015/0007424 A1 | 1/2015 | Iwamoto | |
| 2015/0200129 A1 | 7/2015 | Konishi et al. | |
| 2015/0303098 A1* | 10/2015 | Landru | H01L 21/6835 |
| | | | 438/458 |
| 2016/0056068 A1 | 2/2016 | Hu et al. | |
| 2018/0166622 A1* | 6/2018 | Akiyama | H01L 21/76254 |

FOREIGN PATENT DOCUMENTS

| | | |
|---|---|---|
| JP | 2002534886 A | 10/2002 |
| JP | 200317967 A | 1/2003 |
| JP | 2010109949 A | 5/2010 |
| JP | 2011138932 A | 7/2011 |
| JP | 20125106 A | 1/2012 |
| JP | 2013149853 A | 8/2013 |
| JP | 201546486 A | 3/2015 |
| WO | 2014017369 A1 | 1/2014 |
| WO | 2016194976 A1 | 12/2016 |

OTHER PUBLICATIONS

International Search Report for Application No. PCT/JP2017/014072, dated Jul. 4, 2017.
Liu et al., "Fabrication of Single-Crystalline LiTaO3 Film on Silicon Substrate Using Thin Film Transfer Technology", Journal of Vacuum Science & Technology B: Microelectronics and Nanometer Structures Processing, Measurement, and Phenomena, vol. 26, No. 1, Jan. 2008, pp. 206-208.
Tauzin, et al., "3-inch Single Crystal LiTaO3 Films Onto Metallic Electrode Using Smart Cut Technology", Electronics Letters, vol. 44, No. 13, Jun. 2008, pp. 822-824.
Japanese Office Action for Application No. 2016-075807 dated Oct. 11, 2018.
Japanese Office Action for JP Application No. 2016075807, dated Feb. 14, 2019.
Extended Supplementary European Search Report including the Search Opinion for Application No. EP 17779133.2 dated Aug. 1, 2019, pp. 1-10.
Moriceau et al., "Smart Cut<TM>: Review on an Attractive Process for Innovative Substrate Elaboration", Nuclear Instruments & Methods in Physics Research Section B: Beam Interactions With Materials and Atoms, Elsevier BV, NL, vol. 277, Apr. 15, 2012 (Apr. 15, 2012), p. 84-92, XP002721940.

* cited by examiner

METHOD FOR MANUFACTURING COMPOSITE WAFER PROVIDED WITH OXIDE SINGLE CRYSTAL THIN FILM

CROSS-REFERENCE TO RELATED APPLICATIONS

The present application is a national phase entry under 35 U.S.C. § 371 of International Application No. PCT/JP2017/014072 filed Apr. 4, 2017, published as International Publication No. WO 2017/175755 A1, which claims priority from Japanese Patent Application No. 2016-075807 filed Apr. 5, 2016, all of which are incorporated herein by reference.

TECHNICAL FIELD

The present invention relates to the manufacture of a composite wafer. More specifically, the present invention relates to a method for manufacturing a composite wafer including an oxide single crystal thin film on a support wafer.

BACKGROUND ART

In the field of compact communication devices typified by smartphones, communication traffic has increased steeply, and devices have many more functions. To cope with the increase in communication traffic, the number of bands has been increased, whereas compact communication devices have been required to have many more functions, without increase in size. For various members used in compact communication devices, accordingly, further reduction in size and higher performance are essential.

An oxide single crystal such as lithium tantalate (LT) and lithium niobate (LN) is a typical piezoelectric material and is widely used as a material of surface acoustic wave (SAW) devices. When used as a piezoelectric material, the oxide single crystal, which has a large electromechanical coupling factor indicating a conversion efficiency from electromagnetic energy to mechanical energy, can achieve a wider bandwidth. The oxide single crystal however has low temperature stability, and a temperature change shifts the operable frequency thereof. The low temperature stability arises from a thermal expansion coefficient of the oxide single crystal.

As a method of improving the temperature stability of an oxide single crystal used as an electrical voltage material, the following method is disclosed, for example: an oxide single crystal wafer is bonded to a material having a smaller thermal expansion coefficient than that of the oxide single crystal, specifically, to a sapphire wafer; and the laminate is shaved from the oxide single crystal wafer side into several micrometers to several tens of micrometers, thereby suppressing the effect of the thermal expansion of the oxide single crystal (Non-Patent Document 1). In the method, the oxide single crystal wafer after the lamination is shaved, and thus most of the oxide single crystal wafer is unfortunately discarded, resulting in poor material utilization efficiency. Lithium tantalate or lithium niobate used as the oxide single crystal is an expensive material, and thus to reduce production costs, there is a demand for a technique with high material utilization efficiency to discard small amounts of materials.

The technique of manufacturing an SOI wafer, for example, a Smart-Cut method, is simply a method in which a silicon wafer including a hydrogen ion layer is bonded to a support wafer, and the laminate is heated at about 500° C. to thermally release the ion-implanted layer (Patent Document 1). In order to improve the utilization efficiency of an oxide single crystal wafer in a product, the following method has been tried: an oxide single crystal wafer is used in place of the silicon wafer in the Smart-Cut method to form a thin film of the oxide single crystal on a support wafer (Non-Patent Documents 2 and 3).

Non-Patent Document 2 discloses the following technique: on the surface of a lithium tantalate wafer including an ion-implanted layer, a Cr metal layer having a thickness of 121 nm is formed; a $SiO_2$ substrate having a thickness of several hundreds of nanometers is bonded through the metal layer; the laminate is heated at 200 to 500° C. to separate the laminate along the ion-implanted layer, thus transferring a lithium tantalate thin film onto the $SiO_2$ substrate through the metal layer; and then a lithium tantalate wafer is bonded to the face of the $SiO_2$ substrate opposite to the face to which the lithium tantalate thin film has been transferred, thereby manufacturing a lithium-tantalate-metal-on-insulator (LT-MOI) structure. Non-Patent Document 3 discloses the following technique: a silicon wafer is bonded to a lithium tantalate wafer including an ion-implanted layer; and the laminate is heated at 200° C. to separate the laminate along the ion-implanted layer, thereby thermally transferring a lithium tantalate thin film onto the silicon wafer.

REFERENCE DOCUMENT LIST

Patent Document

Patent Document 1: JP 3048201 B

Non-Patent Documents

Non-Patent Document 1: Taiyo Yuden Co., Ltd., "Temperature compensation technology for SAW-Duplexer used in RF front end of smartphone", [online], Nov. 8, 2012, Dempa Shimbun High Technology, [searched on Mar. 20, 2015], the Internet (URL: http://www.yuden.co.jp/jp/product/tech/column/20121108.html)

Non-Patent Document 2: A Tauzin et al., "3-inch single-crystal LiTaO3 films onto metallic electrode using Smart Cut™ technology", Electronics Letters, 19 Jun. 2008, Vol. 44, No. 13, p. 822

Non-Patent Document 3: Weill Liu et al., "Fabrication of single-crystalline LiTaO3 film on silicon substrate using thin film transfer technology", J. Vac. Sci. Technol. B26 (1), January/February 2008, p. 206

SUMMARY OF THE INVENTION

Problem to be Solved by the Invention

Oxide single crystals such as lithium tantalate (LT) and lithium niobate (LN) are hard and very brittle and have a markedly large thermal expansion coefficient as compared with silicon, glass, and sapphire as shown in FIG. 4. When such an oxide single crystal is bonded with a different type of wafer such as a silicon, glass, or sapphire wafer and is heated at a high temperature, the bonded wafers are unfortunately separated or cracked due to difference in thermal expansion coefficient between the wafers. For example, the difference in thermal expansion coefficient between lithium tantalate and sapphire, which is typically used as a support wafer and has a particular large thermal expansion coefficient, is as large as 7×10⁻⁶/K (=7 ppm/K) or more, as is apparent from FIG. 4.

Non-Patent Document 2 is a report that a structure including a metal layer and a $SiO_2$ substrate between a lithium tantalate wafer and a lithium tantalate thin film is used to suppress separation or cracking of the wafer due to difference in thermal expansion at the time of heat treatment and to enable transfer of the lithium tantalate thin film. However, the method uses, as the underlayer substrate, lithium tantalate that is the same as the thin film, and thus, poor temperature stability is still the problem for the piezoelectric material. In addition, the structure interposing the metal layer is limited in application. Moreover, large amounts of expensive lithium tantalate is required to be used in order to suppress cracking of the wafer, resulting in higher production costs.

Non-Patent Document 3 discloses a heat treatment at 200 to 800° C. but discloses only a specific example in which the Smart-Cut method is used to transfer a lithium tantalate thin film onto a silicon wafer at 200° C., and in the example, there is no description of whether or not the lithium tantalate thin film was able to be transferred onto the entire face of the silicon wafer. The inventors of the present invention performed a verification experiment on the release by heat treatment at 200° C. using a similar method to that in Non-Patent Document 3 and found that the lithium tantalate thin film was not completely transferred onto the entire face of the silicon wafer but was transferred onto only a small part of the face. In particular, the lithium tantalate thin film was not transferred onto the circumferential area of the silicon wafer at all. This is thought to be because the bonded wafers warped during the heat treatment due to difference in thermal expansion between the wafers, and the wafers were separated along the bonding interface with the lithium tantalate wafer in the circumferential area of the silicon wafer. If the heat treatment temperature is set at 200° C. or higher, it is assumed that the warpage of the bonded wafers due to difference in thermal expansion between the wafers is also not suppressed as described above, and the lithium tantalate thin film cannot be stably transferred to the entire face of the silicon wafer.

The oxide single crystal thin film released and transferred by the method according to Non-Patent Document 2 or 3 may have insufficient bonding strength to the support wafer. When heat treatment (for example, 300° C. or higher) after release and transfer is performed in order to improve the joining power between a support wafer and an oxide single crystal thin film, the joining power can be improved, but stress is simultaneously generated due to difference in expansion coefficient between the support wafer and the oxide single crystal thin film and may partly release the oxide single crystal thin film before the increase of the joining power.

Means for Solving the Problem

In other words, an aspect of the present invention provides a method for manufacturing a composite wafer including an oxide single crystal thin film on a support wafer, the method at least including the steps:

implanting atomic hydrogen ions or molecular hydrogen ions through a surface of an oxide single crystal wafer that is a lithium tantalate wafer or a lithium niobate wafer to form an ion-implanted layer in the oxide single crystal wafer;

subjecting at least one of the ion-implanted surface of the oxide single crystal wafer and a surface of a support wafer to be bonded to the oxide single crystal wafer, to a surface activation treatment;

after the surface activation treatment, bonding the ion-implanted surface of the oxide single crystal wafer to the surface of the support wafer to yield a laminate;

subjecting the laminate to a first heat treatment at a temperature not less than 90° C. and not causing cracking;

applying a mechanical impact to the ion-implanted layer of the laminate after the first heat treatment, thus separating the laminate along the ion-implanted layer to yield an oxide single crystal thin film transferred onto the support wafer; and subjecting the support wafer having the transferred oxide single crystal thin film to a second heat treatment at 250° C. to 600° C. to yield a composite wafer.

In the method, the atomic hydrogen ions are implanted at an implantation dose of $5.0×10^{16}$ atoms/cm² to $2.75×10^{17}$ atoms/cm², or the molecular hydrogen ions are implanted at an implantation dose of $2.5×10^{16}$ molecules/cm² to $1.37×10^{17}$ molecules/cm².

Another aspect of the present invention provides a composite wafer including an oxide single crystal thin film of lithium tantalate or lithium niobate on a support wafer.

Effects of the Invention

The manufacturing method according to the present invention enables production of a composite wafer in which an oxide single crystal thin film having a uniform thickness is transferred onto the entire face of a support wafer, and the composite wafer has high adhesion on the bonding interface between the support wafer and the oxide single crystal thin film and is unlikely to cause separation or cracking. In addition, the separated oxide single crystal wafer after transfer of the oxide single crystal thin film onto the support wafer can be used for another composite wafer once again, and this can reduce costs.

MODE FOR CARRYING OUT THE INVENTION

Figure 1:
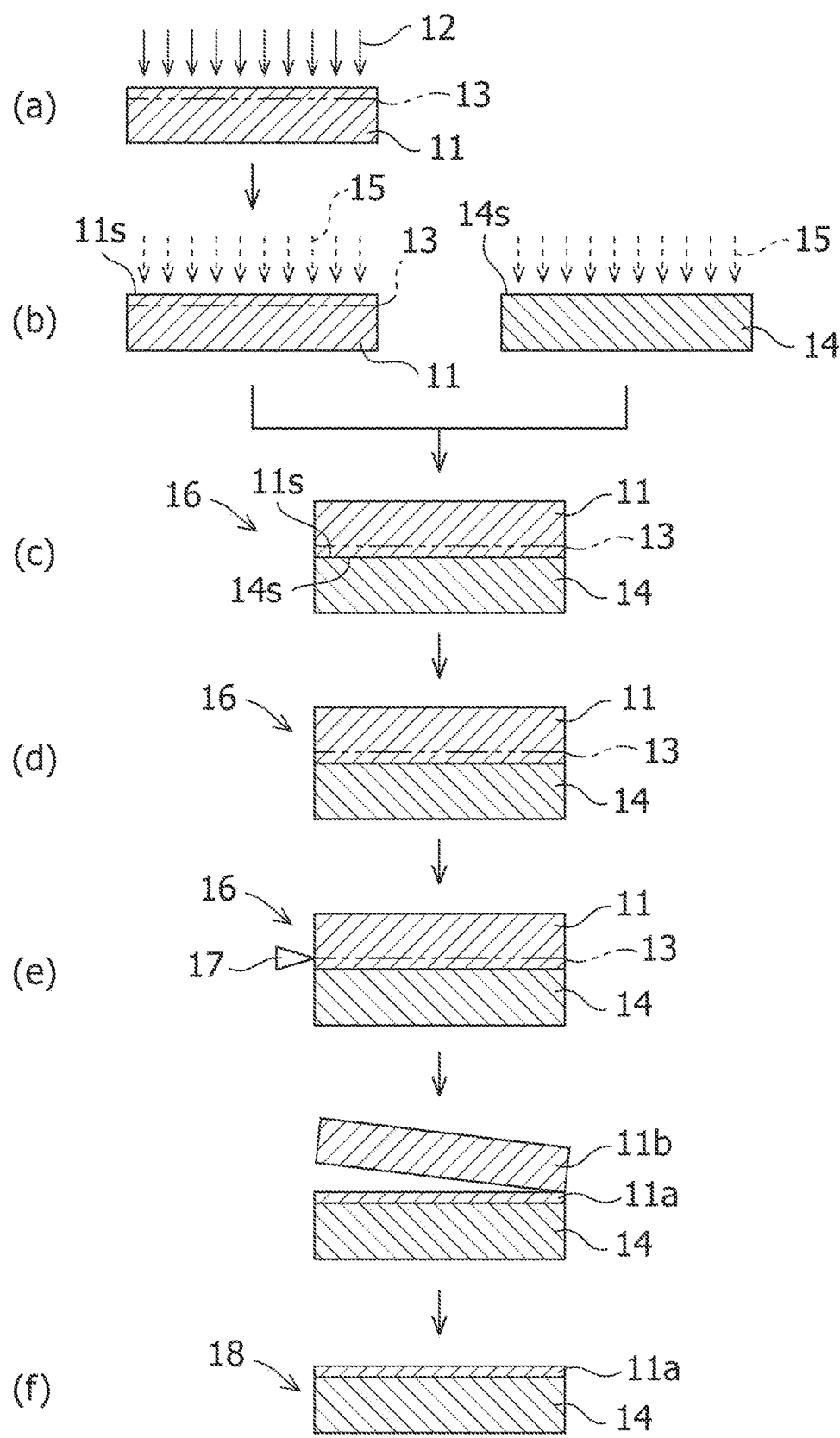
FIGS. 1(a)-1(f) are schematic views of a method for manufacturing a composite wafer in an embodiment of the present invention.

Embodiments for carrying out the present invention will now be described in detail, but the scope of the invention is not limited to the embodiments.

An embodiment of the present invention relates to a method for manufacturing a composite wafer including an oxide single crystal thin film on a support wafer.

The support wafer may be a wafer made from a material having a smaller thermal expansion coefficient than that of an oxide single crystal wafer to be bonded by at least 7 ppm/K, for example. Examples of the support wafer include a sapphire wafer, a silicon wafer, a silicon wafer with an oxide film, and a glass wafer. The support wafer may be of any size, and a wafer having a diameter of 75 to 150 mm and a thickness of 0.2 to 0.8 mm can be used, for example. The support wafer may be a commercially available wafer but is not particularly limited thereto. For example, the silicon wafer with an oxide film is a silicon wafer at least having an oxide film on a surface to be bonded and may be prepared by heating a silicon wafer at 700 to 1,200° C. in the atmosphere to form an oxide film on the surface of the silicon wafer. The oxide film of the silicon wafer with an oxide film may have any thickness, but the thickness is preferably 10 to 500 nm.

The oxide single crystal is a compound containing lithium, a metal element such as tantalum or niobium, and oxygen and includes lithium tantalate ($LiTaO_3$) and lithium niobate ($LiNbO_3$), for example. The oxide single crystal is preferably a lithium tantalate single crystal or a lithium niobate single crystal especially in the application of laser devices, piezoelectric elements, surface acoustic wave devices, and the like. The oxide single crystal is typically used in the form of a wafer. The oxide single crystal wafer may have any size, and a wafer having a diameter of 75 to 150 mm and a thickness of 0.2 to 0.8 mm can be used, for example. The oxide single crystal wafer may be a commercially available wafer or may be produced by simply using a reported production method including the Czochralski method (for example, JP 2003-165795 A and JP 2004-079061 T) or by a combination of processes disclosed therein.

Each of the support wafer and the oxide single crystal wafer preferably has a surface roughness RMS of 1.0 nm or less on the surface to be bonded. If a surface having a surface roughness RMS of more than 1.0 nm is bonded, voids may be generated on the bonding interface, resulting in peeling. Hence, a surface having a surface roughness RMS of more than 1.0 nm may be subjected to chemical mechanical polishing (CMP) to have an intended surface roughness. The surface roughness RMS can be evaluated by atomic force microscopy (AFM), for example.

Hydrogen ions are implanted through a surface of the oxide single crystal wafer to form an ion-implanted layer in the oxide single crystal wafer. The ion-implanted layer is formed by implanting a predetermined dose of atomic hydrogen ions ($H^+$) or molecular hydrogen ions ($H_2$) at such an implantation energy so as to form an ion-implanted layer at an intended depth from the surface of the oxide single crystal wafer. As a condition for the implantation, the implantation energy can be 50 to 200 keV, for example. For atomic hydrogen ions ($H^+$), the implantation dose is $5.0 \times 10^{16}$ atoms/cm$^2$ to $2.75 \times 10^{17}$ atoms/cm$^2$. If the implantation dose is less than $5.0 \times 10^{16}$ atoms/cm$^2$, the ion-implanted layer does not cause embrittlement in a later step. If the implantation dose is more than $2.75 \times 10^{17}$ atoms/cm$^2$, microcavities are generated on the ion-implanted face at the time of ion-implantation to form unevenness on the wafer surface, and an intended surface roughness cannot be achieved. For molecular hydrogen ions ($H_2^+$), the implantation dose is $2.5 \times 10^{16}$ molecules/cm$^2$ to $1.37 \times 10^{17}$ molecules/cm$^2$. If the implantation dose is less than $2.5 \times 10^{16}$ molecules/cm$^2$, the ion-implanted layer does not cause embrittlement in a later step. If the implantation dose is more than $1.37 \times 10^{17}$ molecules/cm$^2$, microcavities are generated on the ion-implanted face at the time of ion-implantation, forming unevenness on the wafer surface, and intended desired surface roughness cannot be achieved. The implantation dose of atomic hydrogen ions can be twice the implantation dose of molecular hydrogen ions.

Next, at least one of the ion-implanted surface of the oxide single crystal wafer and a surface of the support wafer to be bonded to the oxide single crystal wafer is subjected to a surface activation treatment. The surface to be subjected to the surface activation treatment may be both the ion-implanted surface of the oxide single crystal wafer and a surface of the support wafer to be bonded to the oxide single crystal wafer or may be at least one of the surfaces. The surface activation treatment eliminates the need for heat treatment at a high temperature for improving the bonding strength after bonding, and an intended bonding strength can be achieved even at a relatively low temperature. Especially when a hard, brittle oxide single crystal wafer such as lithium tantalate and lithium niobate and a support wafer having a much smaller thermal expansion coefficient than that of the oxide single crystal wafer are subjected to such a surface activation treatment as above and then bonded to each other, a large shear stress generated in a direction parallel with the bonding interface due to difference, in thermal expansion coefficient between the oxide single crystal wafer and the support wafer, in a later heat treatment at a relatively low temperature does not break the bonding interface having a sufficient bonding strength against the shear stress owing to the surface activation treatment, but can help to break the ion-implanted layer to such a degree as not to be released.

Examples of the surface activation treatment include ozone water treatment, UV ozone treatment, ion beam treatment, and plasma treatment. When ozone is used for the treatment, ozone gas can be introduced into pure water to yield an ozone water, and a wafer can be immersed in the ozone water, thereby activating the surface with the active ozone, for example. When UV ozone treatment is performed, short-wavelength UV light (for example, a wavelength of about 195 nm) can be applied to air or oxygen gas to generate active ozone, and a wafer can be held in the resulting atmosphere, thereby activating the surface, for example. When ion beam treatment is performed, an ion beam such as Ar can be applied to the surface of a wafer in high vacuum (for example, less than $1 \times 10^{-5}$ Pa) to expose highly active dangling bonds, for example. When plasma is used for the treatment, a wafer can be placed in a vacuum chamber and exposed to a plasma gas under a reduced pressure (for example, 0.2 to 1.0 mTorr) for about 5 to 60 seconds, thus performing the plasma treatment on the surface, for example. As the plasma gas, an oxygen gas can be used when the surface is oxidized, and a hydrogen gas, a nitrogen gas, an argon gas, or a gas mixture thereof can be used when the surface is not oxidized. By the plasma treatment, organic substances on the wafer surface are oxidized and removed, and the surface has more OH groups and is activated.

Next, after the surface activation treatment, the ion-implanted surface of the oxide single crystal wafer and the surface of the support wafer are bonded to yield a laminate. As for the temperature when the oxide single crystal wafer and the support wafer are bonded, the bonding is preferably performed at a temperature around room temperature (including room temperature), for example, at 10 to 50° C. The composite wafer as the end product is typically used around room temperature, and the bonding is preferably performed also around this temperature range. The temperature at the time of bonding can be a temperature in a place where the bonding is performed or can be the ambient temperature or the temperature in an apparatus. The temperature at the time of bonding can be controlled by setting the temperature in a bonding apparatus, for example. The room temperature is the ambient temperature when a subject is not heated or cooled and is not limited to particular values but is, for example, 10 to 30° C., preferably around 25° C.

Next, the laminate is subjected to a first heat treatment at a temperature not less than 90° C. and not causing cracking, for example, on the bonding interface. If the temperature is less than 90° C., the bonding interface between the oxide single crystal wafer and the support wafer may have an insufficient bonding strength, and the laminate may be separated along the bonding interface. The temperature for the first heat treatment may be changed depending on a support wafer used. For example, when the support wafer is a sapphire wafer, the temperature in the first heat treatment step is preferably 90 to 225° C. and more preferably 90 to 200° C. When the support wafer is a silicon wafer or a silicon wafer with an oxide film, the temperature is preferably 90 to 200° C. and more preferably 90 to 175° C. When the support wafer is a glass wafer, the temperature is preferably 90 to 110° C. and more preferably 90 to 100° C. By heating the laminate at a temperature not less than 90° C. and not causing cracking, the joining power of the bonding interface between the support wafer and the oxide single crystal wafer can be improved, and the ion-implanted layer can easily cause embrittlement in a later step. Examples of the heat treatment means include, but are not necessarily limited to, a heat-treating furnace and an oven. The temperature of the laminate can be the temperature in a furnace or an oven measured by using a thermocouple or the like provided in the heat treatment apparatus, for example. The time for the heat treatment at the above temperature is not limited to particular values as long as cracking or release is not caused and can be from 10 minutes to several tens of hours, for example, up to 100 hours. For example, when the heat treatment temperature is not less than 90° C. and is less than 110° C., the heat treatment time is preferably 10 minutes to 100 hours; when the heat treatment temperature is not less than 110° C. and less than 175° C., the heat treatment time is preferably 10 minutes to 60 hours; when the heat treatment temperature is not less than 175° C. and less than 200° C., the heat treatment time is preferably 10 minutes to 24 hours; and when the heat treatment temperature is not less than 200° C. and less than 225° C., the heat treatment time is preferably 10 minutes to 12 hours. According to the present invention, a laminate without a protective wafer can be heated, and this can further simplify the process.

The laminate after the first heat treatment is preferably cooled to a temperature around room temperature (including room temperature), for example, 10 to 50° C. For example, the laminate after the heat treatment may be allowed to stand in a room conditioned at 25° C. to an intended temperature. When the laminate is at a temperature around room temperature that is substantially the same as at the time of bonding, the stress of the laminate can be reduced, and the laminate can be unlikely to cause cracks or defects in a later step of applying a mechanical impact.

Next, a mechanical impact is applied to the ion-implanted layer in the laminate after the first heat treatment, thus the laminate is separated along the ion-implanted layer, and the oxide single crystal thin film is transferred onto the support wafer. The means applying the mechanical impact may be any means, and a separation device such as a sharp tool and a wedge-shaped sharp blade can be used, or a jet of a fluid such as a gas or a liquid can be used. The separation device such as a sharp tool and a wedge-shaped sharp blade may be any separation device and can be prepared from a plastic (for example, polyether ether ketone), a metal, zirconia, silicon, diamond, or the like. As the sharp tool, a wedge or a blade of scissors or the like can be used. The jet of a fluid such as a gas or a liquid may be any fluid jet, and a high-pressure air jet or a high-pressure water jet at a flow rate of about 10 to 1,000 L/min can be used, for example. The fluid jet may be sprayed continuously or intermittently to an end of the ion-implanted layer in the laminate, for example.

The mechanical impact can be applied, for example, to a side face of the laminate, for example, by bringing a wedge-shaped blade into contact with an end of the ion-implanted layer or by inserting a wedge-shaped blade into an end of the ion-implanted layer to separate the laminate along the ion-implanted layer. The mechanical impact can be applied, for example, by spraying a gas or liquid fluid, such as a high-pressure air jet or a high-pressure water jet, continuously or intermittently to an end of the ion-implanted layer in the laminate to separate the laminate along the ion-implanted layer. In addition, while a wedge-shaped blade is in contact with an end of the ion-implanted layer in the laminate, a gas or liquid fluid, such as a high-pressure air jet or a high-pressure water jet, can be continuously or intermittently sprayed to the side face in contact with the blade, thereby separating the laminate along the ion-implanted layer, for example. The separation is preferably cleavage from one end to the other end.

Before the application of the mechanical impact to the ion-implanted layer in the laminate, a reinforcing material is preferably fixed to one surface or each surface of the laminate in some cases. For example, a reinforcing material may be attached to a side face on the support wafer in the laminate, a side face on the oxide single crystal wafer in the laminate, or each side face on the support wafer and the oxide single crystal wafer in the laminate. The reinforcing material is preferably a vacuum chuck, an electrostatic chuck, a reinforcing plate, or a protection tape. The vacuum chuck may be any vacuum chuck and includes vacuum chucks of porous polyethylene, alumina, and the like. The electrostatic chuck may be any electrostatic chuck and includes electrostatic chucks made from ceramics such as silicon carbide and aluminum nitride. The vacuum chuck and the electrostatic chuck may have any shape and are preferably larger than the diameter of the laminate. The reinforcing plate may be any reinforcing plate and can be prepared from a plastic, a metal, a ceramic, or the like. The reinforcing plate may have any shape and is preferably larger than the diameter of the laminate. The reinforcing plate may be fixed to the laminate with a double-sided adhesive tape, for example. The material, the thickness, and the like of the protection tape are not limited, and, for example, a dicing tape or a BG tape used in a semiconductor manufacturing process can be used. By using the reinforcing material, separation other than the ion-implanted layer or cracking of the laminate can be more reliably prevented when the mechanical impact is applied to the laminate, and the separation can be reliably performed.

In the present invention, the mechanical impact may include ultrasonic vibration. For example, ultrasonic vibration may be applied to the laminate after the heat treatment to separate the laminate along the ion-implanted layer, thereby giving an oxide single crystal thin film transferred onto the support wafer. Ultrasonic waves are elastic vibration waves (sound waves) having a high frequency. The method of applying ultrasonic vibration to the laminate may be any method, and an oscillator, for example, a wedge-shaped blade to which ultrasonic waves are applied, such as an ultrasonic cutter, can be brought into contact with a side face of the laminate, for example, with an end of the ion-implanted layer to apply ultrasonic vibration. The frequency of the ultrasonic waves is not limited to particular values as long as the ion-implanted layer can cause embrittlement without any effect on the bonding interface and is preferably 20 to 40 kHz. As another method of applying vibration to the laminate, a water bath with an oscillator, such as a ultrasonic cleaner, can be used, and vibration can be applied through a liquid to the laminate immersed in the water bath to which ultrasonic waves are applied. When ultrasonic vibration is applied through a liquid to the laminate, immersion for 1 to 60 minutes in a water bath to which ultrasonic vibration is applied enables more reliable separation of the laminate along the ion-implanted layer. In this case, the frequency is preferably 26 kHz to 1.6 MHz. The above two methods can be performed in combination.

When ultrasonic waves are applied, a reinforcing material such as a vacuum chuck or an electrostatic chuck is preferably fixed to one surface or each surface of the laminate in some cases. For example, a reinforcing material may be attached to a side face on the support wafer in the laminate, a side face on the oxide single crystal wafer in the laminate, or each side face on the support wafer and the oxide single crystal wafer in the laminate. The vacuum chuck may be any vacuum chuck and includes vacuum chucks of porous polyethylene, alumina, and the like. The electrostatic chuck may be any electrostatic chuck and includes electrostatic chucks made from ceramics such as silicon carbide and aluminum nitride. The vacuum chuck and the electrostatic chuck may have any shape and are preferably larger than the diameter of the laminate. By using the reinforcing material, separation other than the ion-implanted layer or cracking of the laminate can be more reliably prevented when ultrasonic vibration is applied to the laminate, and the separation can be reliably performed.

In the step of applying a mechanical impact, the temperature of the laminate at the time of the application of a mechanical impact to the laminate is preferably a temperature around room temperature (including room temperature), for example, 10 to 50° C., and more preferably 25 to 30° C., where the laminate is heated or cooled or is not heated or cooled. The temperature of the laminate at the time of the application of a mechanical impact can be the ambient temperature, for example, the temperature in a furnace or an oven measured by using a thermocouple or the like provided in the heat treatment apparatus or can be a room temperature in a workplace. The temperature of the laminate at the time of the application of a mechanical impact to the laminate has a predetermined, preferred temperature range from the temperature at the time of bonding in the step of giving the laminate. For example, the difference between the temperature at the time of bonding to yield the laminate and the temperature of the laminate at the time of the application of a mechanical impact is preferably 0 to 40° C., and the difference is desirably closer to 0° C. If the difference exceeds the predetermined, preferred temperature range, the laminate may separate or crack along the bonding interface. By setting the difference in temperature between the laminates at the time of bonding and at the time of the application of a mechanical impact within a predetermined range, the warpage stress caused by thermal expansion in the step of applying a mechanical impact can be minimized, and defects and the like can be suppressed as much as possible. The step of producing the laminate is typically performed in a clean-room environment (25 to 30° C.), for example. In this case, the step of applying a mechanical impact is also preferably performed at a similar atmosphere temperature or about 25 to 30° C.

Next, the support wafer having the transferred oxide single crystal thin film obtained as above is subjected to a second heat treatment at a temperature of 250 to 600° C. to yield a composite wafer. If the temperature is less than 250° C., the hydrogen ion distribution is likely to be high near the surface of the oxide single crystal thin film and is likely to be low on the joining interface, and a strong join cannot be achieved. If the temperature is more than 600° C., defects including cracks are generated at the joining interface due to a difference in thermal expansion coefficient between the oxide single crystal thin film and the support wafer. The temperature increase rate to the above temperature is not limited to particular values and can be less than 10.0° C./min or can be not less than 10.0° C./min and not more than such a rate as not to cause film peeling, for example, 150.0° C./min or less. For example, the temperature increase rate can be 1.0 to 5.0° C./min, 10.0° C./min or more and 100.0° C./min or less, or 50.0° C./min or less. For example, the support wafer having the transferred oxide single crystal thin film can be introduced into an atmosphere set at the above temperature (for example, an oven). The atmosphere for the heat treatment is preferably an inert gas atmosphere, and, for example, the heat treatment is preferably performed in a nitrogen atmosphere. The time for the heat treatment is not limited to particular values but is preferably the minimum requirement to reduce costs and can be 1 hour or more and 96 hours or less, for example.

The temperature for the second heat treatment is preferably 250° C. to 400° C. in order to yield a composite wafer including a thin film in which the hydrogen ion concentration is uniform in the entire thin film. The inventors of the present invention have found that heat treatment of a support wafer having a transferred oxide single crystal thin film at 250 to 400° C. enables ion-implanted hydrogen ions to be widely, uniformly distributed in the thin film to achieve strong binding. The heat treatment time is not limited to particular values and is preferably 24 hours or more and 96 hours or less. For example, when the heat treatment temperature is 250° C., the heat treatment time is preferably 48 hours or more and 96 hours or less, and when the temperature is 400° C., the heat treatment time is preferably 24 hours or more and 48 hours or less. By the heating, a composite wafer unlikely to cause separation or cracks can be obtained.

The temperature for the second heat treatment is preferably higher than 400° C. and not higher than 600° C. and more preferably 450° C. to 600° C. from the viewpoint of improvement in joining performance. A support wafer having a transferred oxide single crystal thin film may have insufficient bonding strength for some applications, or a thin film may be partly peeled when the support wafer with the thin film is subjected to a test in which a tape or the like is bonded and peeled (peel test). The inventors of the present invention have found that when an oxide single crystal thin film is transferred onto a support wafer, and then the support wafer with the thin film is subjected to a second heat treatment at a temperature higher than 400° C. and not higher than 600° C., the ion-implanted, supersaturated hydrogen in the single crystal thin film is released out of the thin film (outward diffusion), some of the hydrogen aggregates on the unstable joining interface and is bonded to an unterminated bond (dangling bond) on the joining interface with the support wafer to increase the bonding power, and both the piezoelectric performance and the joining power can be improved simultaneously. In other words, the heating enables a reduction of the ion concentration in the thin film and an increase of the hydrogen ion concentration on the joining interface.

When the second heat treatment is performed at a temperature higher than 400° C. and not higher than 600° C., the temperature increase rate is preferably less than 10.0° C./min from the temperature at which hydrogen starts to move in the thin film or from around 250° C. to the above temperature in one embodiment. For example, the temperature increase rate may be 1.0 to 5.0° C./min, which is typical in a diffusion furnace or the like. In this temperature increase condition, hydrogen in the thin film is not diffused outwardly but can be concentrated around the joining interface. The heat treatment time is preferably 1 hour or more and 48 hours or less. For example, when the temperature is 600° C., the heat treatment time is preferably 1 hour or more and 6 hours or less. By the heating, excess (supersaturated) hydrogen in the oxide single crystal thin film can be removed, and the resulting composite wafer can have a high joining power and excellent piezoelectric performance.

When the second heat treatment is performed at a temperature higher than 400° C. and not higher than 600° C., the temperature increase rate from around 250° C. to the above temperature is preferably 10.0° C./min or more and not more than such a rate as not to cause film peeling and more preferably 20.0° C./min or more and 100.0° C./min or less in another embodiment. By the second heat treatment, the bonding strength on the joining interface can be improved, and separation along the joining interface (also called film peeling) due to a difference in thermal expansion coefficient can be suppressed. This is supposed to be because the increase in bonding strength is sensitive and responds quickly to temperature changes, but the film peeling on a joining interface is caused after the film stress accumulates in a film or on a joining interface to some extent and cannot accumulate any more, and there is some time-lag therebetween. The inventors of the present invention have found that by setting the above temperature rise condition, the bonding strength is ensured before film peeling is caused on the joining interface, and thus, the resistance against film peeling can be improved, and the reliability can be improved. The heat treatment time is not limited to particular values and is preferably 1 hour or more and 48 hours or less. By the heat treatment, film peeling is unlikely to be caused on the joining interface. In addition, the temperature increase rate is higher than those in conventional methods, and thus, the production efficiency can be improved.

At the time of the heat treatment, the oxide single crystal thin film on the support wafer preferably has a thickness of 0.1 to 1.5 μm and more preferably 0.2 to 1.0 μm. When the thin film has a thickness within the above range, peeling or cracking of the oxide single crystal thin film due to a difference in thermal expansion from the support wafer is not caused, and the bonding strength can be improved. The thickness of the thin film can be adjusted by the depth of the ion-implanted layer formed at the time of ion-implantation. Alternatively, the thickness can be adjusted after transfer of the oxide single crystal thin film onto the support wafer. As the latter method, a step of polishing the surface of the oxide single crystal thin film and/or a step of measuring the thickness of the oxide single crystal thin film may be performed after the step of applying a mechanical impact and before the step of giving a composite wafer. The thin film surface can be polished by chemical mechanical polishing (CMP), for example. The thickness of the thin film can be determined by an optical interference film thickness meter, for example.

By using the above technique, a composite wafer including a support wafer and an oxide single crystal thin film that is a lithium tantalate thin film or a lithium niobate thin film on the support wafer can be produced. The thickness of the oxide single crystal thin film in the resulting composite wafer can correspond to the hydrogen ion-implanted depth at the time of hydrogen ion-implantation and is preferably 0.1 to 1.5 μm.

The resulting composite wafer preferably has a hydrogen ion concentration of $5.0 \times 10^{20}$ to $1.0 \times 10^{22}$ atoms/cm$^3$ on the joining interface from the viewpoint of the stability of the joining interface. In this case, the hydrogen concentration in the thin film is likely to be high on and around the joining interface.

Alternatively, except the surface on the oxide single crystal thin film in the resulting composite wafer and the joining interface with the support wafer, the hydrogen ion concentration in the oxide single crystal thin film is preferably $4.0 \times 10^{20}$ to $8.0 \times 10^{20}$ atoms/cm$^3$ in order to achieve strong bonding performance. In this case, the hydrogen concentration in the thin film is not maximum on the thin film surface or the joining interface with the support wafer, but the hydrogen is comparatively uniformly distributed within the above range in the thin film, and the concentration gradient from the thin film surface to the joining interface in the depth direction is not obvious.

The above hydrogen ion concentration is an atomic hydrogen ion concentration. The hydrogen ion concentration can be measured by secondary ion mass spectrometry (SIMS), and concentrations at points from the surface of the oxide single crystal thin film through the joining interface with the support wafer in the depth direction can be determined.

The method of manufacturing the composite wafer of the present invention is not limited to particular methods, and an embodiment thereof is shown in FIG. 1. Through a surface of an oxide single crystal wafer 11, hydrogen ions 12 are implanted to form an ion-implanted layer 13 in the oxide single crystal wafer 11 (step a). Both the ion-implanted surface 11s of the oxide single crystal wafer 11 and a surface 14s of a support wafer 14 to be bonded to the oxide single crystal wafer are subjected to a surface activation treatment by irradiation with ion beams 15 (step b). After the surface activation treatment, the ion-implanted surface 11s of the oxide single crystal wafer is bonded to the surface 14s of the support wafer to be bonded to the oxide single crystal wafer to yield a laminate 16 (step c). The resulting laminate 16 is heated at a temperature not less than 90° C. (step d). With a side face of the laminate 16 after the heat treatment or an end of the ion-implanted layer 13, a wedge-shaped blade 17 is brought into contact to separate a part of the oxide single crystal wafer 11b along the ion-implanted layer 13, thereby transferring an oxide single crystal thin film 11a onto the support wafer 14 (step e). The support wafer 14 having the transferred oxide single crystal thin film 11a is heated at 250° C. to 600° C., thereby giving a composite wafer 18 (step f).

EXAMPLES

Experiment 1

As the support wafer, a sapphire wafer having a diameter of 100 mm and a thickness of 0.35 mm was used. As the oxide single crystal wafer, a lithium tantalate wafer having a diameter of 100 mm and a thickness of 0.35 mm was used. The faces of the sapphire wafer and the lithium tantalate wafer to be bonded to each other had a surface roughness RMS of 1.0 nm or less, which was determined under an atomic force microscope.

First, the faces of the sapphire wafer and the lithium tantalate wafer to be bonded to each other were subjected to surface activation by plasma treatment under a nitrogen atmosphere with a plasma activation apparatus. Next, the surface-activated surfaces of the sapphire wafer and the lithium tantalate wafer were bonded at room temperature (25° C.) to yield a laminate. Each of the laminates was heated to 70, 80, 90, 100, 110, 125, 150, 175, 200, 225, 250, or 275° C. and heat-treated at the corresponding temperature for 24 hours. As the heating means, a heat treatment oven was used, and the temperature in the oven was measured with a thermocouple to yield the temperature of the laminate. The appearance inspection results of the obtained laminates are shown in Table 1. The appearance inspection was visually performed. A laminate without cracking or chipping was evaluated as "good", a laminate with microscopic cracks was evaluated as "poor", and a broken wafer was evaluated as "failure". When the support wafer was sapphire, a sample heat-treated at a temperature of 70 to 225° C. had no cracks or chips, and the joining was ascertained.

Experiment 2

The same procedure as in Experiment 1 was performed except that a silicon wafer having a diameter of 100 mm and a thickness of 0.35 mm was used as the support wafer, and each of the laminates was heated to 70, 80, 90, 100, 110, 125, 150, 175, 200, or 225° C. and heat-treated at the corresponding temperature for 24 hours. The faces of the silicon wafer and the lithium tantalate wafer to be bonded to each other had a surface roughness RMS of 1.0 nm or less. The appearance inspection results of the obtained laminates are shown in Table 1. When the support wafer was silicon, a sample heat-treated at a temperature of 70 to 200° C. had no cracks or chips, and the joining was ascertained.

Experiment 3

The same procedure as in Experiment 1 was performed except that a silicon wafer with a 100-nm oxide film on the silicon wafer having a diameter of 100 mm and a thickness of 0.35 mm was used as the support wafer, and each of the laminates was heated to 70, 80, 90, 100, 110, 125, 150, 175, 200, or 225° C. and heat-treated at the corresponding temperature for 24 hours. The faces of the silicon wafer with an oxide film and the lithium tantalate wafer to be bonded to each other had a surface roughness RMS of 1.0 nm or less. The appearance inspection results of the obtained laminates are shown in Table 1. The silicon wafer with an oxide film was prepared by previously heating a silicon wafer at 1,100° C. for about 1 hour to form a 100-nm thermal oxide film on the silicon wafer. When the support wafer was the silicon with an oxide film, a sample heat-treated at a temperature of 70 to 200° C. had no cracks or chips, and the joining was ascertained.

Experiment 4

The same procedure as in Experiment 1 was performed except that a glass wafer having a diameter of 100 mm and a thickness of 0.35 mm was used as the support wafer, and each of the laminates was heated to 70, 80, 90, 100, 110, or 125° C. and heat-treated at the corresponding temperature for 24 hours. The faces of the glass wafer and the lithium tantalate wafer to be bonded to each other had a surface roughness RMS of 1.0 nm or less. The appearance inspection results of the obtained laminates are shown in Table 1. When the support wafer was glass, a sample heat-treated at a temperature of 70 to 110° C. had no cracks or chips, and the joining was ascertained.

TABLE 1

| Support wafer type (Experiment) | Temperature of laminate in heat treatment step/° C. | | | | | | | | | | | |
|---|---|---|---|---|---|---|---|---|---|---|---|---|
| | 70 | 80 | 90 | 100 | 110 | 125 | 150 | 175 | 200 | 225 | 250 | 275 |
| Sapphire (Experiment 1) | Good | Good | Good | Good | Good | Good | Good | Good | Good | Good | Poor | Failure |
| Silicon (Experiment 2) | Good | Good | Good | Good | Good | Good | Good | Good | Good | Poor | — | — |
| Silicon with oxide film (Experiment 3) | Good | Good | Good | Good | Good | Good | Good | Good | Good | Poor | — | — |
| Glass (Experiment 4) | Good | Good | Good | Good | Good | Poor | — | — | — | — | — | — |

Although the lithium tantalate wafers were used in Experiments 1 to 4, when a lithium niobate wafer was used as the oxide single crystal wafer to perform substantially the same experiments as in Experiments 1 to 4, substantially the same results as in Table 1 were obtained. When the surface activation treatment was performed by ozone water treatment, UV ozone treatment, or vacuum ion beam treatment in place of the plasma treatment, the same results were obtained. These results reveal that each of the above activation methods was effective, and there was no difference between lithium tantalate and lithium niobate.

Experiment 5

As the support wafer, a sapphire wafer having a diameter of 100 mm and a thickness of 0.35 mm was used. As the oxide single crystal wafer, a lithium tantalate wafer having a diameter of 100 mm and a thickness of 0.35 mm was used. The faces of the sapphire wafer and the lithium tantalate wafer to be bonded to each other had a surface roughness RMS of 1.0 nm or less.

First, through a surface of the lithium tantalate wafer, atomic hydrogen ions were ion-implanted in conditions at an implantation dose of $7.0 \times 10^{16}$ atoms/cm$^2$ and an acceleration voltage of 100 KeV to form an ion-implanted layer in the lithium tantalate wafer (a depth of 680 nm). The surface of the ion-implanted lithium tantalate wafer and the surface of the sapphire wafer to be bonded to the lithium tantalate wafer were then subjected to surface activation by vacuum ion beam treatment with a vacuum ion beam apparatus at $7\times10^{-6}$ Pa using Ar as the ion source. Next, the surface-activated surfaces of the sapphire wafer and the lithium tantalate wafer were bonded at room temperature (25° C.) to yield a laminate. Each of the laminates was heated to 70, 80, 90, 100, 110, 125, 150, 175, 200, or 225° C. and heat-treated at the corresponding temperature for 24 hours. As the heating means, a heat treatment oven was used, and the temperature in the oven was measured with a thermocouple to give the temperature of the laminate. The laminate after the heat treatment was allowed to stand at room temperature, and then, at room temperature (25° C.), a wedge-shaped blade was brought into contact with the ion-implanted layer in the laminate to separate the laminate along the ion-implanted layer, thereby transferring a lithium tantalate thin film onto the sapphire wafer. The evaluation result of the appearance inspection on the obtained sapphire wafer having the transferred lithium tantalate thin film is shown in Table 2. The appearance inspection was visually performed. A sample in which a thin film was satisfactory transferred onto the entire face of a wafer as evaluated as "Good", a sample in which a thin film was not transferred in some area was evaluated as "poor", a sample in which a thin film was not transferred was evaluated as "failure".

Experiment 6

The same procedure as in Experiment 5 was performed except that a silicon wafer having a diameter of 100 mm and a thickness of 0.35 mm was used as the support wafer, and each of the laminates was heated to 70, 80, 90, 100, 110, 125, 150, 175, or 200° C. and heat-treated at the corresponding temperature for 24 hours. The faces of the silicon wafer and the lithium tantalate wafer to be bonded to each other had a surface roughness RMS of 1.0 nm or less. The evaluation results are shown in Table 2.

Experiment 7

The same procedure as in Experiment 5 was performed except that a silicon wafer with a 100-nm oxide film on the silicon wafer having a diameter of 100 mm and a thickness of 0.35 mm was used as the support wafer, and each of the laminates was heated to 70, 80, 90, 100, 110, 125, 150, 175, or 200° C. and heat-treated at the corresponding temperature for 24 hours. The faces of the silicon wafer with an oxide film and the lithium tantalate wafer to be bonded to each other had a surface roughness RMS of 1.0 nm or less. The evaluation results are shown in Table 2. The silicon wafer with an oxide film was prepared by previously heating a silicon wafer at 1,100° C. for 1 hour to form a 100-nm thermal oxide film on the silicon wafer.

Experiment 8

The same procedure as in Experiment 5 was performed except that a glass wafer having a diameter of 100 mm and a thickness of 0.35 mm was used as the support wafer, and each of the laminates was heated to 70, 80, 90, 100, or 110° C. and heat-treated at the corresponding temperature for 24 hours. The faces of the glass wafer and the lithium tantalate wafer to be bonded to each other had a surface roughness RMS of 1.0 nm or less. The evaluation results are shown in Table 2.

TABLE 2

| Support wafer type (Experiment) | Temperature of laminate in heat treatment step/° C. | | | | | | | | | | |
|---|---|---|---|---|---|---|---|---|---|---|---|
| | 70 | 80 | 90 | 100 | 110 | 125 | 150 | 175 | 200 | 225 | 250 |
| Sapphire (Experiment 5) | Failure | Poor | Good | Good | Good | Good | Good | Good | Good | Good | — |
| Silicon (Experiment 6) | Failure | Poor | Good | Good | Good | Good | Good | Good | Good | — | — |
| Silicon with oxide film (Experiment 7) | Failure | Poor | Good | Good | Good | Good | Good | Good | Good | — | — |
| Glass (Experiment 8) | Failure | Poor | Good | Good | Good | — | — | — | — | — | — |

As shown in Table 2, in a sample in which the support wafer was sapphire and the heat treatment temperature was 90 to 225° C., a sample in which the support wafer was silicon and the heat treatment temperature was 90 to 200° C., a sample in which the support wafer was silicon with an oxide film and the heat treatment temperature was 90 to 200° C., and a sample in which the support wafer was glass and the heat treatment temperature was 90 to 110° C., each lithium tantalate thin film was ascertained to be transferred onto the entire face of the support wafer.

On each support wafer, when the heat treatment temperature was 70° C., no separation along the ion-implanted layer was observed, but separation along the interface between the bonded wafers was observed. When the heat treatment temperature was 80° C., the support wafer has an area onto which the lithium tantalate thin film was transferred and an area onto which the thin film was not transferred. When the heat treatment temperature was 70° C. or 80° C., embrittlement was insufficient on the ion-implanted interface, the joining power between the wafers was insufficient, and thus the transfer onto the entire area was supposed to have failed.

Substantially the same experiments as in Experiments 5 to 8 were performed by using a lithium niobate wafer as the oxide single crystal wafer, giving substantially the same results as in Table 2. When the surface activation treatment was performed by ozone water treatment, UV ozone treatment, or plasma treatment in place of the vacuum ion beam treatment, the results were the same.

Experiment 9

The same procedure as in Experiment 5 was performed except that through a surface of the lithium tantalate wafer, atomic hydrogen ions were ion-implanted in conditions at an implantation dose of $4.0\times10^{16}$, $5.0\times10^{16}$, $7.5\times10^{16}$, $10\times10^{16}$, $12.5\times10^{16}$, $15\times10^{16}$, $17.5\times10^{16}$, $20\times10^{16}$, $22.5\times10^{16}$, $25\times10^{16}$, or $27.5\times10^{16}$ atoms/cm$^2$ and an acceleration voltage of 100 KeV to form an ion-implanted layer in the lithium tantalate wafer, and the laminate was heated at 90° C. for 24 hours.

Experiment 10

As the oxide single crystal wafer, a lithium tantalate wafer having a diameter of 100 mm and a thickness of 0.35 mm was used. The face of the lithium tantalate wafer to be bonded had a surface roughness RMS of 1.0 nm or less. Through the surface of the lithium tantalate wafer, atomic hydrogen ions were ion-implanted in conditions at an implantation dose of $30\times10^{16}$ atoms/cm$^2$ and an acceleration voltage of 100 KeV to form an ion-implanted layer in the lithium tantalate wafer. As a result, unevenness was observed on the surface of the lithium tantalate wafer before bonding and failed to achieve an intended surface roughness for bonding, and thus the bonding was not performed. The unevenness on the surface of the lithium tantalate wafer was supposed to be because implanted hydrogen was not completely dissolved in a solid and foamed in the wafer.

Experiment 11

The same procedure as in Experiment 6 was performed except that through a surface of the lithium tantalate wafer, atomic hydrogen ions were ion-implanted in conditions at an implantation dose of $4.0\times10^{16}$, $5.0\times10^{16}$, $7.5\times10^{16}$, $10\times10^{16}$, $12.5\times10^{16}$, $15\times10^{16}$, $17.5\times10^{16}$, $20\times10^{16}$, $22.5\times10^{16}$, $25\times10^{16}$, or $27.5\times10^{16}$ atoms/cm$^2$ and an acceleration voltage of 100 KeV to form an ion-implanted layer in the lithium tantalate wafer, and the laminate was heated at 90° C. for 24 hours.

Experiment 12

The same procedure as in Experiment 7 was performed except that through a surface of the lithium tantalate wafer, atomic hydrogen ions were ion-implanted in conditions at an implantation dose of $4.0\times10^{16}$, $5.0\times10^{16}$, $7.5\times10^{16}$, $10\times10^{16}$, $12.5\times10^{16}$, $15\times10^{16}$, $17.5\times10^{16}$, $20\times10^{16}$, $22.5\times10^{16}$, $25\times10^{16}$, or $27.5\times10^{16}$ atoms/cm$^2$ and an acceleration voltage of 100 KeV to form an ion-implanted layer in the lithium tantalate wafer, and the laminate was heated at 90° C. for 24 hours.

Experiment 13

The same procedure as in Experiment 8 was performed except that through a surface of the lithium tantalate wafer, atomic hydrogen ions were ion-implanted in conditions at an implantation dose of $4.0\times10^{16}$, $5.0\times10^{16}$, $7.5\times10^{16}$, $10\times10^{16}$, $12.5\times10^{16}$, $15\times10^{16}$, $17.5\times10^{16}$, $20\times10^{16}$, $22.5\times10^{16}$, $25\times10^{16}$, or $27.5\times10^{16}$ atoms/cm$^2$ and an acceleration voltage of 100 KeV to form an ion-implanted layer in the lithium tantalate wafer, and the laminate was heated at 90° C. for 24 hours.

It was ascertained that when the atomic hydrogen ion implantation dose was $5.0\times10^{16}$ to $27.5\times10^{16}$ atoms/cm$^2$, the lithium tantalate thin film was transferred onto the entire face of any of the support wafers. In contrast, when the atomic hydrogen ion implantation dose was $4.0\times10^{16}$ atoms/cm$^2$, no separation of the lithium tantalate wafer along the ion-implanted layer was observed on any of the support wafers. This is supposed to be because the ion implantation dose was insufficient to cause embrittlement in the later step.

Although atomic hydrogen ions were used in Experiments 9 to 13, when molecular hydrogen ions were used in an implantation dose of half the implantation dose of the atomic hydrogen ions, substantially the same results were obtained. Even when a lithium niobate wafer was used as the oxide single crystal wafer, substantially the same results were obtained.

In Examples 1 to 16, the second heat treatment was performed at a temperature of 250 to 400° C. to yield a composite wafer, which was evaluated.

Example 1

As the support wafer, a sapphire wafer having a diameter of 100 mm and a thickness of 0.35 mm was used. As the oxide single crystal wafer, a lithium tantalate wafer having a diameter of 100 mm and a thickness of 0.35 mm was used. The faces of the sapphire wafer and the lithium tantalate wafer to be bonded to each other had a surface roughness RMS of 1.0 nm or less.

First, through a surface of the lithium tantalate wafer, atomic hydrogen ions were ion-implanted in conditions of an implantation dose of $9.5\times10^{16}$ atoms/cm$^2$ and an acceleration voltage of 100 KeV to form an ion-implanted layer in the lithium tantalate wafer (a depth of 680 nm from the surface). Next, the surface of the ion-implanted lithium tantalate wafer and the surface of the sapphire wafer to be bonded to the lithium tantalate wafer were subjected to surface activation by vacuum ion beam treatment with a vacuum ion beam apparatus at $7\times10^{-6}$ Pa using Ar as the ion source. The surface-activated surfaces of the sapphire wafer and the lithium tantalate wafer were then bonded at room temperature (25° C.) to yield a laminate. Next, the laminate was heated to 115° C. and heat-treated at the temperature for 48 hours. As the heating means, a heat treatment oven was used, and the temperature in the oven was measured with a thermocouple to give the temperature of the laminate. The laminate after the heat treatment was allowed to stand to room temperature, and then, at room temperature (25° C.), a wedge-shaped blade was brought into contact with the ion-implanted layer in the laminate to separate the laminate along the ion-implanted layer, thereby transferring a lithium tantalate thin film onto the sapphire wafer. The lithium tantalate thin film on the sapphire wafer was polished with a chemical mechanical polishing apparatus to form a mirror surface, giving a thin film having a thickness of 325 nm. The sapphire wafer having the transferred lithium tantalate thin film was then heated under a nitrogen atmosphere at 250° C. for 24 hours, giving a composite wafer. The heating means used for the heat treatment was also a heat treatment oven, and the temperature in the oven was measured with a thermocouple to set the atmosphere temperature at 250° C. The thickness of the thin film was determined with an optical interference film thickness meter.

The evaluated results of the resulting composite wafer by peel test and crack inspection are shown in Table 3. In the peel test, a polyimide tape called a Kapton tape was attached to the surface on the thin film of the composite wafer, then was sufficiently in close contact with the surface, and was peeled off for evaluation. The appearance inspection after the peel test was visually performed. A sample without peeling was evaluated as "Good", and a sample partly peeled was evaluated as "poor". In the crack inspection, the entire face of the composite wafer was visually observed. A sample with no cracks was evaluated as "Good", a sample with one to three cracks was evaluated as "poor", and a sample with four or more cracks was evaluated as "failure".

Examples 2 to 4

The same procedure as in Example 1 was performed except that the sapphire wafer having the transferred lithium tantalate thin film was heated under a nitrogen atmosphere at 300° C. (Example 2), 350° C. (Example 3), or 400° C. (Example 4) for 24 hours to yield a composite wafer. The evaluation results of the resulting composite wafers are shown in Table 3.

Comparative Example 1

The same procedure as in Example 1 was performed except that the sapphire wafer having the transferred lithium tantalate thin film was heated under a nitrogen atmosphere at 200° C. for 24 hours to yield a composite wafer. The evaluation results of the resulting composite wafer are shown in Table 3.

Example 5

The same procedure as in Example 1 was performed except that the lithium tantalate thin film transferred onto the sapphire wafer was polished into a thickness of 350 nm, giving a composite wafer. The evaluation results of the resulting composite wafer are shown in Table 3.

Examples 6 to 8

The same procedure as in Example 5 was performed except that the sapphire wafer having the transferred lithium tantalate thin film was heated under a nitrogen atmosphere at 300° C. (Example 6), 350° C. (Example 7), or 400° C. (Example 8) for 24 hours to yield a composite wafer. The evaluation results of the resulting composite wafers are shown in Table 3.

Comparative Example 2

The same procedure as in Example 5 was performed except that the sapphire wafer having the transferred lithium tantalate thin film was heated under a nitrogen atmosphere at 200° C. for 24 hours to yield a composite wafer. The evaluation results of the resulting composite wafer are shown in Table 3.

Example 9

The same procedure as in Example 1 was performed except that the lithium tantalate thin film transferred onto the sapphire wafer was polished into a thickness of 1.0 μm, giving a composite wafer. The evaluation results of the resulting composite wafer are shown in Table 3.

Examples 10 to 12

The same procedure as in Example 9 was performed except that the sapphire wafer having the transferred lithium tantalate thin film was heated under a nitrogen atmosphere at 300° C. (Example 10), 350° C. (Example 11), or 400° C. (Example 12) for 24 hours to yield a composite wafer. The evaluation results of the resulting composite wafers are shown in Table 3.

Comparative Example 3

The same procedure as in Example 9 was performed except that the sapphire wafer having the transferred lithium tantalate thin film was heated under a nitrogen atmosphere at 200° C. for 24 hours to yield a composite wafer. The evaluation results of the resulting composite wafer are shown in Table 3.

Example 13

The same procedure as in Example 1 was performed except that the lithium tantalate thin film transferred onto the sapphire wafer was polished into a thickness of 1.5 μm, giving a composite wafer. The evaluation results of the resulting composite wafer are shown in Table 3.

Examples 14 to 16

The same procedure as in Example 13 was performed except that the sapphire wafer having the transferred lithium tantalate thin film was heated under a nitrogen atmosphere at 300° C. (Example 14), 350° C. (Example 15), or 400° C. (Example 16) for 24 hours to yield a composite wafer. The evaluation results of the resulting composite wafers are shown in Table 3.

Comparative Example 4

The same procedure as in Example 13 was performed except that the sapphire wafer having the transferred lithium tantalate thin film was heated under a nitrogen atmosphere at 200° C. for 24 hours to yield a composite wafer. The evaluation results of the resulting composite wafer are shown in Table 3.

[Table 3]

TABLE 3

| Thickness of oxide single crystal thin film | Evaluation items | Heat treatment temperature after release/° C. | | | | |
|---|---|---|---|---|---|---|
| | | 200 | 250 | 300 | 350 | 400 |
| 325 nm (Examples 1 to 4, Comparative Example 1) | Peel test Crack inspection | Poor Good | Good Good | Good Good | Good Good | Good Good |
| 350 nm (Examples 5 to 8, Comparative Example 2) | Peel test Crack inspection | Poor Good | Good Good | Good Good | Good Good | Good Good |
| 1.0 μm (Examples 9 to 12, Comparative Example 3) | Peel test Crack inspection | Poor Good | Good Good | Good Good | Good Good | Good Good |
| 1.5 μm (Examples 13 to 16, Comparative Example 4) | Peel test Crack inspection | Poor Good | Good Good | Good Good | Good Good | Good Good |

As shown in Table 3, when a laminate including an oxide single crystal thin film having a film thickness of 325 nm or more and 1.5 μm or less was treated at a heat treatment temperature after release of 250 to 400° C., hydrogen did not completely escape due to outward diffusion, and a satisfactory oxide single crystal thin film in which hydrogen was uniformly dispersed was able to be produced. In the above results, the oxide single crystal thin films had a film thickness of 1.5 μm or less. This is because the current hydrogen ion implantation technique achieves such a thickness as the maximum limit. In the future, the ion implantation technique can be improved to achieve a thickness more than the above. When the surface activation treatment was performed by ozone water treatment, UV ozone treatment, or plasma activation treatment in place of the vacuum ion beam treatment or when lithium niobate was used in place of lithium tantalate, the same results were obtained.

In Example 17 and Examples 18 to 21, changes of hydrogen ion concentration in a composite wafer by the second heat treatment were examined.

Example 17

As the support wafer, a sapphire wafer having a diameter of 100 mm and a thickness of 0.35 mm was used. As the oxide single crystal wafer, a lithium tantalate wafer having a diameter of 100 mm and a thickness of 0.35 mm was used. The faces of the sapphire wafer and the lithium tantalate wafer to be bonded to each other had a surface roughness RMS of 1.0 nm or less.

First, through a surface of the lithium tantalate wafer, atomic hydrogen ions were ion-implanted in conditions of an implantation dose of $7.0 \times 10^{16}$ atoms/cm$^2$ and an acceleration voltage of 100 KeV to form an ion-implanted layer in the lithium tantalate wafer (a depth of 680 nm from the surface). Next, the surface of the ion-implanted lithium tantalate wafer and the surface of the sapphire wafer to be bonded to the lithium tantalate wafer were subjected to surface activation by vacuum ion beam treatment with a vacuum ion beam apparatus at $7 \times 10^{-6}$ Pa using Ar as the ion source. The surface-activated surfaces of the sapphire wafer and the lithium tantalate wafer were then bonded at room temperature (25° C.) to yield a laminate. Next, the laminate was heated to 130° C. and heat-treated at the temperature for 24 hours. As the heating means, a heat treatment oven was used, and the temperature in the oven was measured with a thermocouple to give the temperature of the laminate. The laminate after the heat treatment was allowed to stand to room temperature, and then, at room temperature (25° C.), a wedge-shaped blade was brought into contact with the ion-implanted layer in the laminate to separate the laminate along the ion-implanted layer, thereby transferring a lithium tantalate thin film onto the sapphire wafer. The lithium tantalate thin film on the sapphire wafer was polished with a chemical mechanical polishing apparatus to form a mirror surface, giving a thin film having a thickness of 500 nm. The sapphire wafer having the transferred lithium tantalate thin film was then heated under a nitrogen atmosphere at 450° C. for 6 hours, giving a composite wafer. The heating means used for the heat treatment was also a heat treatment oven, and the temperature in the oven was measured with a thermocouple. The temperature increase rate from 250° C. to the heating temperature was 20.0° C./min, and the atmosphere temperature was set at 450° C. The thickness of the thin film was determined with an optical interference film thickness meter.

Figure 2:
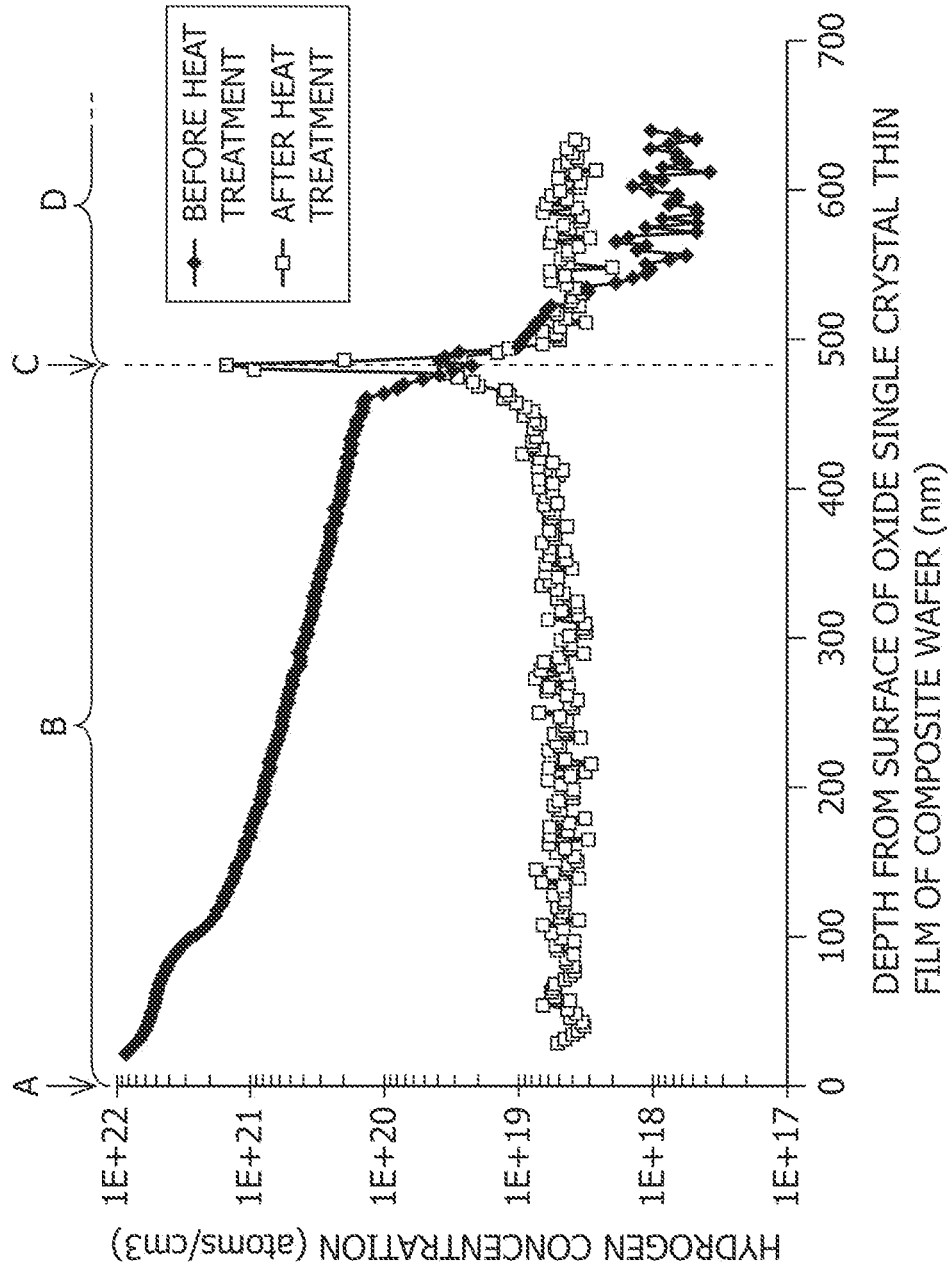
FIG. 2 is a graph showing the relation between the thickness (depth) direction from the surface of an oxide single crystal thin film of a composite wafer and the hydrogen ion concentration in the composite wafer, before and after heat treatment after release.

Before the heat treatment, the hydrogen ion concentrations of the lithium tantalate thin film transferred onto the sapphire wafer were determined, and after the heat treatment, the hydrogen ion concentrations were also determined. The results are shown in FIG. 2. Specifically, the hydrogen ion concentrations were determined from the lithium tantalate thin film surface (A), in the film (B), near the joining interface with the sapphire wafer (C), to a part of the sapphire wafer (D) and were plotted in the depth direction as the hydrogen ion concentration distribution. FIG. 2 reveals that immediately after separation, a large amount of hydrogen was left in the film, then heat treatment in certain conditions released excess hydrogen out of the film, and a part of the hydrogen aggregated on the interface.

Example 18

As the support wafer, a sapphire wafer having a diameter of 100 mm and a thickness of 0.35 mm was used. As the oxide single crystal wafer, a lithium tantalate wafer having a diameter of 100 mm and a thickness of 0.35 mm was used. The faces of the sapphire wafer and the lithium tantalate wafer to be bonded to each other had a surface roughness RMS of 1.0 nm or less.

First, through a surface of the lithium tantalate wafer, atomic hydrogen ions were ion-implanted in conditions of an implantation dose of $9.5 \times 10^{16}$ atoms/cm$^2$ and an acceleration voltage of 130 KeV to form an ion-implanted layer in the lithium tantalate wafer (a depth of 850 nm from the surface). Next, the surface of the ion-implanted lithium tantalate wafer and the surface of the sapphire wafer to be bonded to the lithium tantalate wafer were subjected to surface activation by vacuum ion beam treatment with a vacuum ion beam apparatus at $7 \times 10^{-6}$ Pa using Ar as the ion source. The surface-activated surfaces of the sapphire wafer and the lithium tantalate wafer were then bonded at room temperature (25° C.) to yield a laminate. Next, the laminate was heated to 110° C. and heat-treated at the temperature for 48 hours. As the heating means, a heat treatment oven was used, and the temperature in the oven was measured with a thermocouple to give the temperature of the laminate. The laminate after the heat treatment was allowed to stand at room temperature, and then, at room temperature (25° C.), a wedge-shaped blade was brought into contact with the ion-implanted layer in the laminate to separate the laminate along the ion-implanted layer, thereby transferring a lithium tantalate thin film onto the sapphire wafer. The lithium tantalate thin film on the sapphire wafer was polished with a chemical mechanical polishing apparatus to form a mirror surface, giving a thin film having a thickness of 500 nm. The sapphire wafer having the transferred lithium tantalate thin film was then heated under a nitrogen atmosphere at 400° C. for 6 hours, giving a composite wafer. The heating means used for the heat treatment was also a heat treatment oven, and the temperature in the oven was measured with a thermocouple. The temperature increase rate from 250° C. to the heating temperature was 5.0° C./min, and the atmosphere temperature was set at 400° C. The thickness of the thin film was determined with an optical interference film thickness meter.

Figure 3:
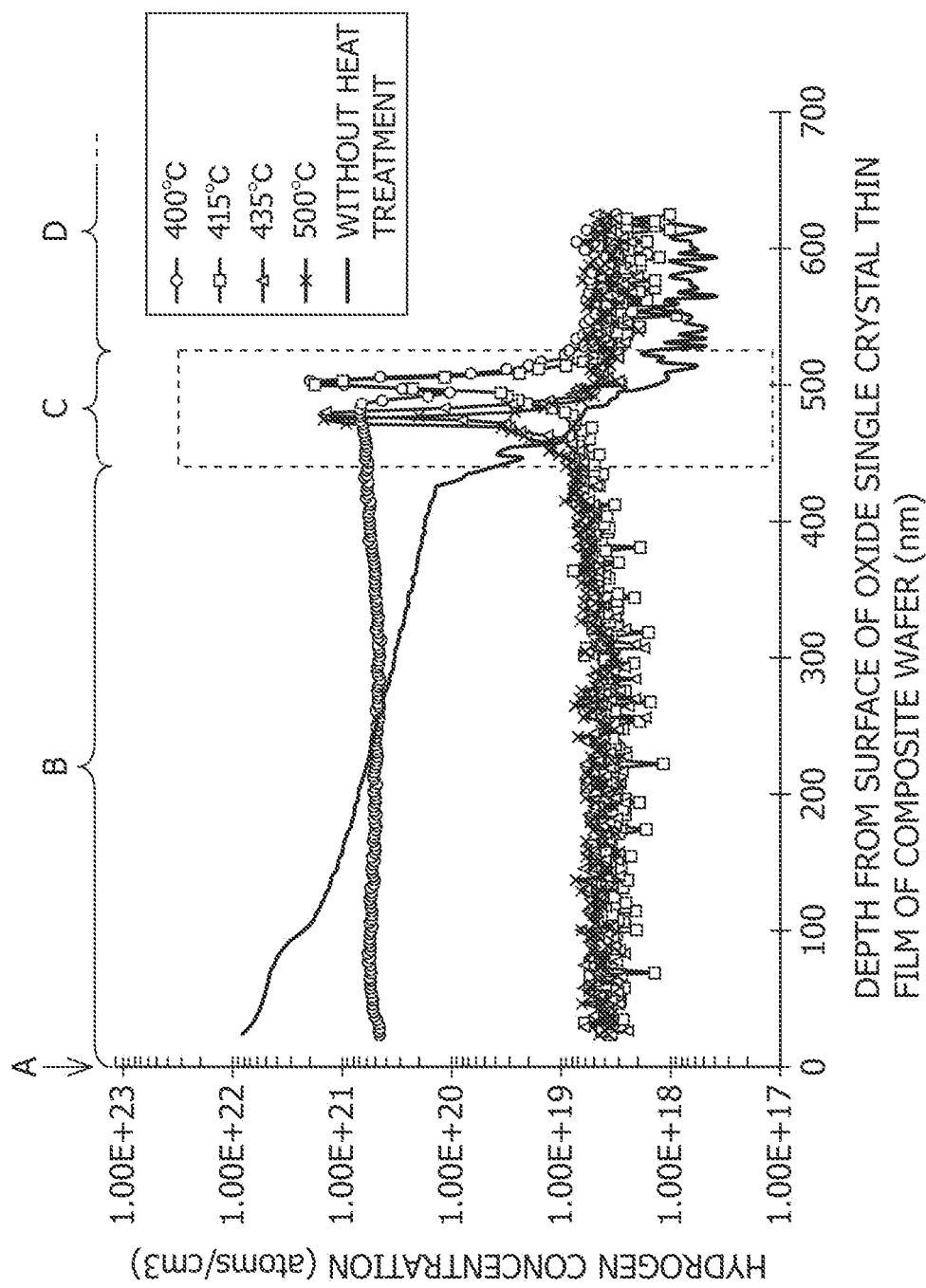
FIG. 3 is a graph showing the relation between the thickness (depth) direction from the surface of an oxide single crystal thin film of a composite wafer and the hydrogen ion concentration in the composite wafer, before heat treatment after release and after heat treatment at 400 to 500° C. after release.
Figure 4:
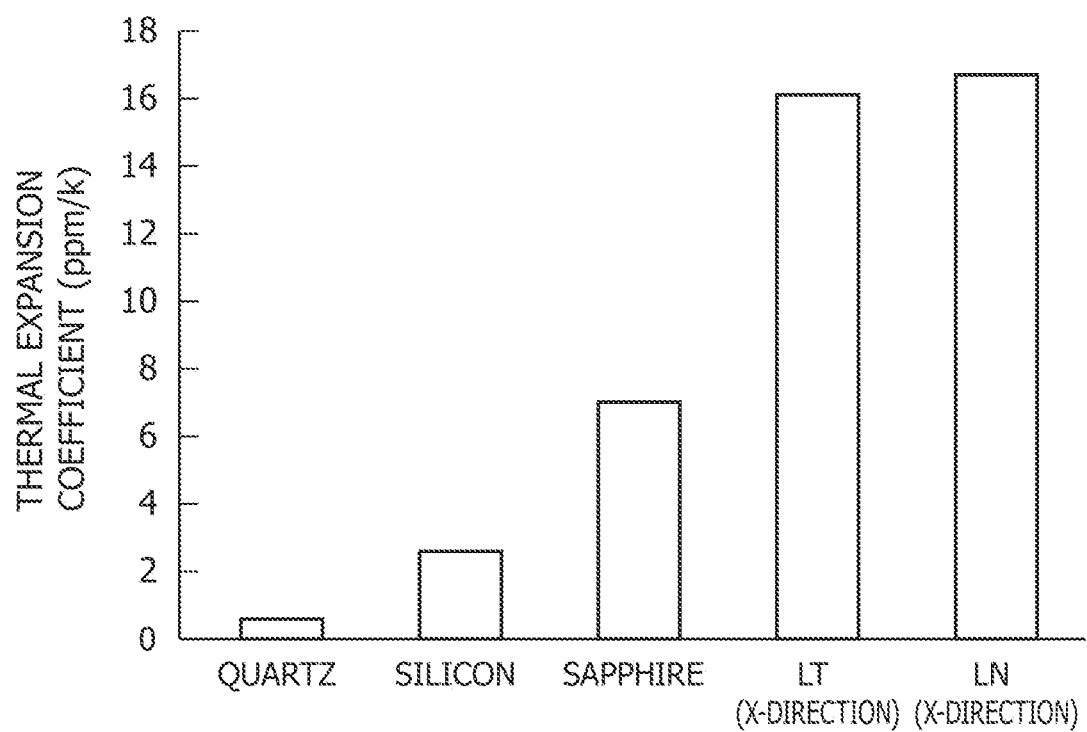
FIG. 4 is a graph comparing thermal expansion coefficients of various materials.

Before the heat treatment, the hydrogen ion concentrations of the lithium tantalate thin film transferred onto the sapphire wafer were determined, and after the heat treatment, the hydrogen ion concentrations were also determined. The results are shown in FIG. 3. The hydrogen ion concentrations were determined by secondary ion mass spectrometry (SIMS). Specifically, the hydrogen ion concentration distribution from the lithium tantalate thin film surface (A), in the film (B), near the interface with the sapphire wafer (C), to a part of the sapphire wafer (D) was determined and plotted in the depth direction.

Examples 19 to 21

The same procedure as in Example 18 was performed except that the lithium tantalate thin film transferred onto the sapphire wafer was polished into 500 nm, and the wafer with the polished thin film was heated under a nitrogen atmosphere at 415° C. (Example 19), 435° C. (Example 20), or 500° C. (Example 21) for 6 hours to yield a composite wafer. The hydrogen ion concentrations of the resulting composite wafers were determined, and the results are shown in FIG. 3.

FIG. 3 reveals that the lithium tantalate thin film transferred onto the sapphire wafer before heat treatment had the highest hydrogen ion concentration on the thin film surface, and the concentration decreased toward the joining interface with the support wafer. In contrast, the composite wafers prepared by heat treatment at 415° C., 435° C., or 500° C. had low hydrogen ion concentrations not higher than the detectable limit in the thin films. In the composite wafer prepared by heat treatment at 400° C., hydrogen ions were distributed at a uniform concentration in the depth direction. The above results suggest that only in a certain temperature region, a thin film in which hydrogen ions are distributed at a uniform concentration in the depth direction can be obtained. The hydrogen ion concentration in the thin film of the composite wafer prepared by heat treatment at 400° C. ranged from $4.0 \times 10^{20}$ to $8.0 \times 10^{20}$ atoms/cm$^3$. The reason the composite wafer prepared by heat treatment at 400° C. had a uniform distribution of hydrogen ions in the thin film in the depth direction of the film is thought to be as follows: heating helps ion-implanted ions to move in the oxide single crystal thin film, and accordingly the ions localize to stable sites in the crystal. It is also a notable phenomenon that some hydrogen ions move to the joining interface between the thin film and the support wafer and terminate unstable chemical bond sites. The localization of hydrogen ions to particular sites in the oxide single crystal thin film is supposed to improve piezoelectricity, and hydrogen ions shifted to the joining interface are supposed to contribute to stabilization of chemical bonds on the interface. In contrast, it is supposed that in the composite wafers prepared by heat treatment at a temperature higher than 400° C., the localized hydrogen obtains sufficient thermal energy for escape, and thus the hydrogen disappears from the thin film.

In Examples 22 to 25, the second heat treatment was performed at a temperature higher than 400° C. and not higher than 600° C. and at a temperature increase rate of less than 10.0° C./min, giving composite wafers.

Example 22

As the support wafer, a sapphire wafer having a diameter of 100 mm and a thickness of 0.35 mm was used. As the oxide single crystal wafer, a lithium tantalate wafer having a diameter of 100 mm and a thickness of 0.35 mm was used. The faces of the sapphire wafer and the lithium tantalate wafer to be bonded to each other had a surface roughness RMS of 1.0 nm or less.

First, through a surface of the lithium tantalate wafer, atomic hydrogen ions were ion-implanted in conditions of an implantation dose of $7.0 \times 10^{16}$ atoms/cm$^2$ and an acceleration voltage of 100 KeV to form an ion-implanted layer in the lithium tantalate wafer (a depth of 680 nm from the surface). Next, the surface of the ion-implanted lithium tantalate wafer and the surface of the sapphire wafer to be bonded to the lithium tantalate wafer were subjected to surface activation by vacuum ion beam treatment with a vacuum ion beam apparatus at $7 \times 10^{-6}$ Pa using Ar as the ion source. The surface-activated surfaces of the sapphire wafer and the lithium tantalate wafer were then bonded at room temperature (25° C.) to yield a laminate. Next, the laminate was heated to 130° C. and heat-treated at the temperature for 24 hours. As the heating means, a heat treatment oven was used, and the temperature in the oven was measured with a thermocouple to give the temperature of the laminate. The laminate after the heat treatment was allowed to stand at room temperature, and then, at room temperature (25° C.), a wedge-shaped blade was brought into contact with the ion-implanted layer in the laminate to separate the laminate along the ion-implanted layer, thereby transferring a lithium tantalate thin film onto the sapphire wafer. The lithium tantalate thin film on the sapphire wafer was polished with a chemical mechanical polishing apparatus to form a mirror surface, giving a thin film having a thickness of 500 nm. The sapphire wafer having the transferred lithium tantalate thin film was then heated under a nitrogen atmosphere at 450° C. for 24 hours, giving a composite wafer. The heating means used for the heat treatment was also a heat treatment oven, and the temperature in the oven was measured with a thermocouple. The temperature increase rate from 250° C. to the heating temperature was 9.5° C./min, and the atmosphere temperature was set at 450° C. The thickness of the thin film was determined with an optical interference film thickness meter.

The peak concentration of hydrogen ion (atom), the peel test, and the piezoelectricity of the resulting composite wafer were evaluated, and the results are shown in Table 4. As for the peak concentration of hydrogen ion, concentrations were determined by secondary ion mass spectrometry (SIMS), and the highest point was considered as the peak concentration. A sample having a peak concentration of hydrogen ion of $5.0 \times 10^{20}$ atoms/cm$^3$ or more was considered as sufficient selective concentration of hydrogen ions on the joining interface. In the peel test, a polyimide tape called a Kapton tape was attached to the surface on the thin film of a composite wafer, then was sufficiently in close contact with the surface, and was peeled off for evaluation. The appearance inspection after the peel test was visually performed. A sample without peeling or cracking was evaluated as "good", and a sample with peeling or cracking was evaluated as "failure". For the piezoelectricity, D33 measurement was performed with a Piezoelectric d33/d15 Meter Model ZJ-3BN apparatus manufactured by Institute of Acoustics, Chinese Academy of Science. In a specific method, the surface on the thin film of a composite wafer is struck, and the induced electrical voltage is observed. A sample giving a D33 constant of more than 2.0, which is the minimum detectable limit, was evaluated as good. The lithium tantalate wafer (bulk) has a D33 constant of 13.2 pC/N.

Examples 23 to 25

The same procedure as in Example 22 was performed except that the sapphire wafer having the transferred lithium tantalate thin film was heated under a nitrogen atmosphere at a temperature increase rate of 9.8° C./min from 250° C. and heat-treated at 500° C. (Example 2), 550° C. (Example 3), or 600° C. (Example 4) for 24 hours, giving a composite wafer. The evaluation results of the resulting composite wafers are shown in Table 4.

Comparative Example 5

The same procedure as in Example 22 was performed except that the sapphire wafer having the transferred lithium tantalate thin film was heated under a nitrogen atmosphere at 650° C. for 24 hours, giving a composite wafer. The evaluation results of the resulting composite wafer are shown in Table 4.

TABLE 4

|  | Heat treatment temperature after release/° C. | Hydrogen ion concentration/ (atoms/cm³) | Peel test | Piezoelectricity (D33 constant)/ pC/N |
|---|---|---|---|---|
| Example 22 | 450 | 6.3 | Good | 10.8 |
| Example 23 | 500 | 6.7 | Good | 11.8 |
| Example 24 | 550 | 6.5 | Good | 11.6 |
| Example 25 | 600 | 5.9 | Good | 11.2 |
| Comparative Example 5 | 650 | 5.5 | Failure | 2.0 |

As shown in Table 4, when the sapphire wafer having the transferred lithium tantalate thin film was heated at 650° C., the peak concentration of hydrogen ion was high, but the peak test caused cracking. This is supposed to be because stress caused cracking on the film before a sufficient bonding power was achieved, resulting in a low D33 constant.

In Examples 26 to 40, the second heat treatment was performed at a temperature higher than 400° C. and not higher than 600° C. and at a temperature increase rate of 10.0° C./min or more, giving composite wafers.

Example 26

As the support wafer, a silicon wafer having a diameter of 100 mm and a thickness of 0.35 mm was used. As the oxide single crystal wafer, a lithium tantalate wafer having a diameter of 100 mm and a thickness of 0.35 mm was used. The faces of the silicon wafer and the lithium tantalate wafer to be bonded to each other had a surface roughness RMS of 1.0 nm or less.

First, through a surface of the lithium tantalate wafer, atomic hydrogen ions were ion-implanted in conditions of an implantation dose of $8.0 \times 10^{16}$ atom/cm² and an acceleration voltage of 100 KeV to form an ion-implanted layer in the lithium tantalate wafer (a depth of 680 nm from the surface). Next, the surface of the ion-implanted lithium tantalate wafer and the surface of the silicon wafer to be bonded to the lithium tantalate wafer were subjected to surface activation by plasma treatment under a nitrogen atmosphere with a plasma activation apparatus. The surface-activated surfaces of the silicon wafer and the lithium tantalate wafer were then bonded at room temperature (25° C.) to yield a laminate. Next, the laminate was heated to 120° C. and heat-treated at the temperature for 6 hours. As the heating means, a heat treatment oven was used, and the temperature in the oven was measured with a thermocouple to give the temperature of the laminate. The laminate after the heat treatment was allowed to stand at room temperature, and then, at room temperature (25° C.), a wedge-shaped blade was brought into contact with the ion-implanted layer in the laminate to separate the laminate along the ion-implanted layer, thereby transferring a lithium tantalate thin film onto the silicon wafer. The lithium tantalate thin film on the silicon wafer was polished with a chemical mechanical polishing apparatus to form a mirror surface, giving a thin film having a thickness of 500 nm. The silicon wafer having the transferred lithium tantalate thin film was then heated under a nitrogen atmosphere from room temperature (25° C.) to 400° C. at a temperature increase rate of 10.0° C./min and heat-treated for 6 hours, giving a composite wafer. The heating means used for the heat treatment was also a heat treatment oven, and the temperature in the oven was measured with a thermocouple to set the atmosphere temperature at 400° C. The thickness of the thin film was determined with an optical interference film thickness meter.

The resulting composite wafer was subjected to the peel test, and the result is shown in Table 5. In the peel test, a polyimide tape was brought into close contact with the thin film and then peeled, thereby evaluating the bonding strength between the oxide single crystal thin film and the support wafer. After the peel test, appearance inspection was visually performed. A sample without peeling on the thin film surface was evaluated as "good", and a sample with peeling was evaluated as "failure".

Examples 27 and 28

The same procedure as in Example 26 was performed except that the silicon wafer having the transferred lithium tantalate thin film was heated from room temperature to the heat treatment temperature at a temperature increase rate of 15.0° C./min (Example 27) or 20.0° C./min (Example 28) and heat-treated, giving a composite wafer. The evaluation results of the resulting composite wafers are shown in Table 5.

Examples 29 to 31

The same procedure as in Example 26 was performed except that the silicon wafer having the transferred lithium tantalate thin film was heated from room temperature to 400° C. at a temperature increase rate of 10.0° C./min (Example 29), 15.0° C./min (Example 30), or 20.0° C./min (Example 31) and heat-treated, giving a composite wafer. The evaluation results of the resulting composite wafers are shown in Table 5.

Examples 32 to 34

The same procedure as in Example 26 was performed except that the silicon wafer having the transferred lithium tantalate thin film was heated from room temperature to 450° C. at a temperature increase rate of 10.0° C./min (Example 32), 15.0° C./min (Example 33), or 20.0° C./min (Example 34) and heat-treated, giving a composite wafer. The evaluation results of the resulting composite wafers are shown in Table 5.

Examples 35 to 37

The same procedure as in Example 26 was performed except that the silicon wafer having the transferred lithium tantalate thin film was heated from room temperature to 500° C. at a temperature increase rate of 10.0° C./min (Example 35), 15.0° C./min (Example 36), or 20.0° C./min (Example 37) and heat-treated, giving a composite wafer. The evaluation results of the resulting composite wafers are shown in Table 5.

Examples 38 to 40

The same procedure as in Example 1 was performed except that the silicon wafer having the transferred lithium tantalate thin film was heated from room temperature to 550° C. at a temperature increase rate of 10.0° C./min (Example 38), 15.0° C./min (Example 39), or 20.0° C./min (Example 40) and heat-treated, giving a composite wafer. The evaluation results of the resulting composite wafers are shown in Table 5.

TABLE 5

| | Heat treatment temperature after release/ °C. | Peel test result Temperature increase rate for heat treatment after release/ (° C./min) | | |
|---|---|---|---|---|
| | | 10.0 | 15.0 | 20.0 |
| Examples 26, 27, 28 | 350 | Good | Good | Good |
| Examples 29, 30, 31 | 400 | Good | Good | Good |
| Examples 32, 33, 34 | 450 | Good | Good | Good |
| Examples 35, 36, 37 | 500 | Good | Good | Good |
| Examples 38, 39, 40 | 550 | Good | Good | Good |

Table 5 indicates that a sample heat-treated at 350° C. or higher where the temperature increase rate was 10.0° C./min or more caused no microscopic film peeling and achieved strong bonding strength. The above results reveal that heating at a temperature increase rate of 10.0° C./min or more and 20.0° C./min or less to a temperature range not higher than 550° C. causes no film peeling and can achieve sufficient bonding strength.

When the surface activation treatment was performed by ozone water treatment or UV ozone treatment in place of the plasma treatment, substantially the same results were obtained. It is also found that there is no difference between lithium tantalate and lithium niobate.

REFERENCE SYMBOL LIST

11 Oxide single crystal wafer
11s Surface of oxide single crystal wafer
11a Oxide single crystal wafer thin film
11b Oxide single crystal wafer after release
12 Hydrogen ion
13 Ion-implanted layer
14 Support wafer
14s Surface of support wafer
15 Ion beam irradiation
16 Laminate
17 Wedge-shaped blade
18 Composite wafer
A Surface of oxide single crystal thin film
B Oxide single crystal thin film
C Joining interface between oxide single crystal thin film and support wafer
D Support wafer

The invention claimed is:

1. A method for manufacturing a composite wafer including an oxide single crystal thin film on a support wafer, the method at least comprising the steps of:
    implanting atomic hydrogen ions or molecular hydrogen ions through a surface of an oxide single crystal wafer that is a lithium tantalate wafer or a lithium niobate wafer to form an ion-implanted layer in the oxide single crystal wafer;
    subjecting at least one of the ion-implanted surface of the oxide single crystal wafer and a surface of a support wafer to be bonded to the oxide single crystal wafer, to a surface activation treatment;
    after the surface activation treatment, bonding the ion-implanted surface of the oxide single crystal wafer to the surface of the support wafer to yield a laminate;
    subjecting the laminate to a first heat treatment at a temperature not less than 90° C. and not causing cracking;
    applying a mechanical impact to the ion-implanted layer of the laminate after the first heat treatment, thus separating the laminate along the ion-implanted layer to yield an oxide single crystal thin film transferred onto the support wafer; and
    subjecting the support wafer having the transferred oxide single crystal thin film to a second heat treatment at 250° C. to 600° C. to yield a composite wafer,
    wherein the atomic hydrogen ions are implanted at an implantation dose of $5.0 \times 10^{16}$ atoms/cm$^2$ to $2.75 \times 10^{17}$ atoms/cm$^2$, or the molecular hydrogen ions are implanted at an implantation dose of $2.5 \times 10^{16}$ molecules/cm$^2$ to $1.37 \times 10^{17}$ molecules/cm$^2$.

2. The method for manufacturing a composite wafer according to claim 1, wherein the second heat treatment is performed at a temperature of 250° C. to 400° C.

3. The method for manufacturing a composite wafer according to claim 2, wherein the oxide single crystal thin film of the composite wafer has a hydrogen ion concentration of $4.0 \times 10^{20}$ to $8.0 \times 10^{20}$ atoms/cm$^3$ in the oxide single crystal thin film except a surface of the oxide single crystal thin film and a joining interface with the support wafer.

4. The method for manufacturing a composite wafer according to claim 1, wherein the second heat treatment is performed at a temperature higher than 400° C. and not higher than 600° C. and at a temperature increase rate of less than 10.0° C./min from 250° C. to the temperature.

5. The method for manufacturing a composite wafer according to claim 4, wherein the composite wafer has a hydrogen ion concentration of $5.0 \times 10^{20}$ to $1.0 \times 10^{22}$ atoms/cm$^3$ on a joining interface between the support wafer and the oxide single crystal thin film.

6. The method for manufacturing a composite wafer according to claim 1, wherein the second heat treatment is performed at a temperature higher than 400° C. and not higher than 600° C. and at a temperature increase rate of 10.0° C./min or more from 250° C. to the temperature.

7. The method for manufacturing a composite wafer according to claim 1, wherein the support wafer is a wafer selected from the group consisting of a sapphire wafer, a silicon wafer, a silicon wafer with an oxide film, and a glass wafer.

8. The method for manufacturing a composite wafer according to claim 1, wherein the surface activation treatment is selected from ozone water treatment, UV ozone treatment, ion beam treatment, and plasma treatment.

9. The method for manufacturing a composite wafer according to claim 1 wherein the support wafer is a glass wafer, and the temperature in the first heat treatment step is 90 to 110° C.

10. The method for manufacturing a composite wafer according to claim 1, wherein the support wafer is a silicon wafer or a silicon wafer with an oxide film, and the temperature in the first heat treatment step is 90 to 200° C.

11. The method for manufacturing a composite wafer according to claim 1, wherein the support wafer is a sapphire wafer, and the temperature in the first heat treatment step is 90 to 225° C.

12. The method for manufacturing a composite wafer according to claim 1, further comprising a step of polishing a surface of the oxide single crystal thin film, after the step of applying a mechanical impact and before the step of giving a composite wafer.

13. The method for manufacturing a composite wafer according to claim 1, further comprising a step of measuring a thickness of the oxide single crystal thin film, after the step of applying a mechanical impact and before the step of giving a composite wafer.

14. A composite wafer comprising:
an oxide single crystal thin film of lithium tantalate or lithium niobate on a support wafer, wherein the composite wafer has a hydrogen ion concentration of $5.0 \times 10^{20}$ to $1.0 \times 10^{22}$ atoms/cm$^3$ on a joining interface between the support wafer and the oxide single crystal thin film.

15. A composite wafer comprising:
an oxide single crystal thin film of lithium tantalate or lithium niobate on a support wafer, wherein the oxide single crystal thin film of the composite wafer has a hydrogen ion concentration of $4.0 \times 10^{20}$ to $8.0 \times 10^{20}$ atoms/cm$^3$ in the oxide single crystal thin film except a surface of the oxide single crystal thin film and a joining interface with the support wafer.

* * * * *